(12) United States Patent
Vakil et al.

(10) Patent No.: US 6,466,074 B2
(45) Date of Patent: Oct. 15, 2002

(54) LOW SKEW MINIMIZED CLOCK SPLITTER

(75) Inventors: Kersi H. Vakil, Olympia; William N. Roy, Lacey; Jerry G. Jex, Olympia, all of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/820,899

(22) Filed: Mar. 30, 2001

(65) Prior Publication Data

US 2002/0140488 A1 Oct. 3, 2002

(51) Int. Cl.[7] ................................................. H03K 3/00
(52) U.S. Cl. ........................ 327/295; 327/256; 327/257; 327/259; 327/293; 326/82; 326/85; 326/87
(58) Field of Search ................................. 327/256, 257, 327/258, 259, 291, 292, 293, 295, 296, 389, 391, 415, 416; 326/85, 86, 87, 82, 83

(56) References Cited

U.S. PATENT DOCUMENTS 4,456,837 A * 6/1984 Schade, Jr. .................. 327/259
4,785,203 A * 11/1988 Nakamura .................... 326/87
4,890,016 A * 12/1989 Tamaka et al. ............... 326/87
4,987,324 A * 1/1991 Wong et al. .................. 326/83
5,047,659 A * 9/1991 Ullrich ........................ 327/259
5,149,990 A * 9/1992 Yamazaki et al. ............ 326/83
5,568,081 A * 10/1996 Lui et al. ..................... 327/380

* cited by examiner

Primary Examiner—Timothy P. Callahan
Assistant Examiner—An T. Luu
(74) Attorney, Agent, or Firm—Antonelli, Terry, Stout & Kraus, LLP

(57) ABSTRACT

A clock splitter device for forming a clock/inverted clock signal pair. The input clock signal is sent through an initial buffer stage and applied to two parts of a second stage. The second stage includes a single stage buffer and constricted inverter to provide two inverted outputs. The transistor arrangement of these two parts provides an equal delay to the two signal paths. The outputs of these two parts are sent to identical output buffers. Because the two paths have identical transistor delays, and since the metal paths on the board are arranged to have identical delays, the two paths can very low skew therebetween.

32 Claims, 6 Drawing Sheets

LOW SKEW MINIMIZED CLOCK SPLITTER

FIELD

The present invention is directed to a clock generator for producing two clock signals 180° out of phase. More particularly, the present invention is directed to a clock splitter which produces multiple clock signals at different phases having low skew between them where the generators are made of PMOS and NMOS transistors.

BACKGROUND

Many high speed signaling components in electronic devices utilize a fast clock frequency. In such devices, it is often necessary to have clock signals having different phases but the same frequency. Often, the different clock signals are generated from the same original clock signal but with one inverted or otherwise phase delayed to obtain the necessary phase difference. While such a simple approach produces a suitable set of clock signals for many purposes, it is desirable to obtain clock signals having less skew for high speed signaling devices.

Skew in this case is defined as being a measure of the difference in the rising and falling edges of the output clock signals from that which is desired. In particular, if the clock signals are designed to be 180° out of phase, the rising edge of one should be at the same time as the falling edge of the other. Thus, skew is the measure of how far out of alignment the two signals are relative to each other.

One type of disadvantageous arrangement is shown in FIG. 1. In this arrangement of a loaded inverter chain, an input clock signal is applied to two different paths of inverters, one of which has an odd number of inversions and the other an even number. Thus, one of the output signals will be 180° out of phase with the other due to the extra inversion. Capacitive loads 12 are added to the inverter outputs and are adjusted so that the total delay of the inverting path matches the total delay of the non-inverting path. While these two paths can be adjusted in this manner to have an equal delay for a given set of parameters such as voltage, temperature and process, these path delays will vary under other parameters. This is because the load delay was adjusted to equal the propagation delay through an inverter but the inverter delay will vary differently than the wire or load delay for different process corners. Accordingly, while this arrangement can be suitable for some purposes, it does not produce a stable low skew clock signal arrangement.

Another arrangement is shown in FIG. 2A and is known as an exclusive NOR pair. In this arrangement the clock signal forms one input to each of two gates. The other input to one gate is connected to a high voltage (VCC) while the other input of the other gate is connected to a low voltage (VSS). Thus, since one input is always high or always low, outputs are obtained in opposite directions from the two gates. An alternative arrangement has these gates being exclusive OR gates.

FIG. 2B shows a exclusive NOR arrangement for one of the gates in FIG. 2A. In this arrangement, A is the equivalent of the "a" input of FIG. 2A, which is connected either to the high or low voltage source. The B input is the same as the "b" input which is connected to the input clock signal. The CO output is the same as the output "o" from the logic gates. It is clear that the actual circuitry needed for the logic gate is reasonably complex and a number of transistors must be used in order to make such a gate. More importantly, because of the complexity of the device, it is difficult to balance the output to a high degree so that the skew between the two clock signals is minimized. Such a logic tree shown in FIG. 2B would be unbalanced with the A and B input devices being in series. A typical remedy is to add complementary series trees as shown in FIG. 2A. Delay differences due to the A-input N-channel device being above the B-input P-channel device would be complementary compensated by the second series stack with the B input, N-channel device on top. The corresponding A and B P-channel devices are already in parallel. Unfortunately, the inversion created by transistors 20 and 22 is not complementary compensated and thus a delayed mismatch occurs between the two paths. Trying to compensate for this inversion creates an even more complex situation and more sensitivity to varying parameters.

Thus, it is clear that these disadvantageous arrangements have limitations.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 1:
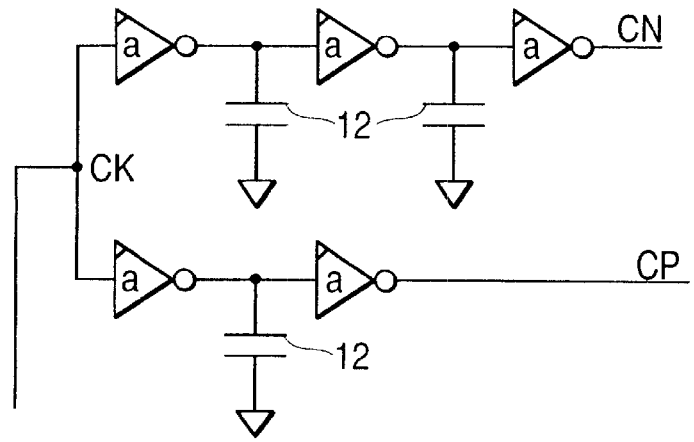
FIG. 1 is an example disadvantageous arrangement useful in gaining a more thorough understanding of the present invention.
Figure 2A:
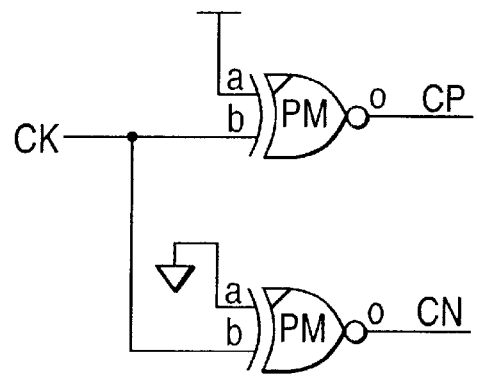
FIG. 2A is an example disadvantageous arrangement useful in gaining a more thorough understanding of the present invention.
Figure 2B:
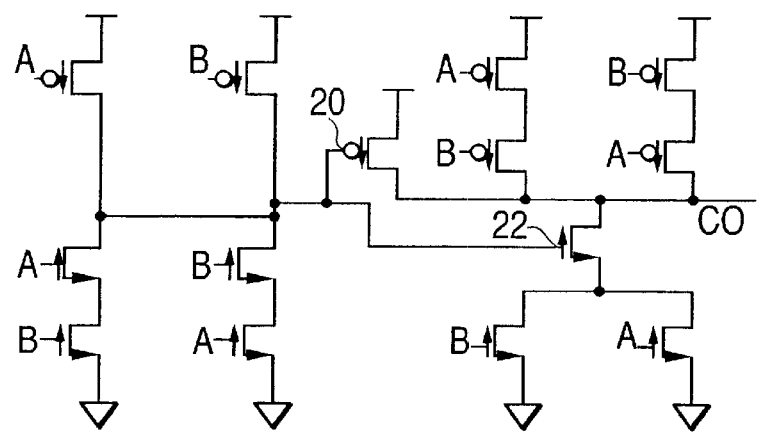
FIG. 2B is a more detailed showing of the example disadvantageous arrangement shown in FIG. 2A.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Still further, the clock and timing signal FIGS. are not drawn to scale, and instead, exemplary and critical time values are mentioned when appropriate. With regard to description of any timing signals, the terms assertion and negation may be used in an intended generic sense. More particularly, such terms are used to avoid confusion when working with a mixture of "active-low" and "active-high" signals, and to represent the fact that the invention is not limited to the illustrated/described signals, but could be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. As a final note, well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits, flowcharts) are set forth in order to describe example embodiments of the invention, it should be apparent to one skilled in the art that the invention can be practiced without, or with variation of, these specific details.

Figure 3:
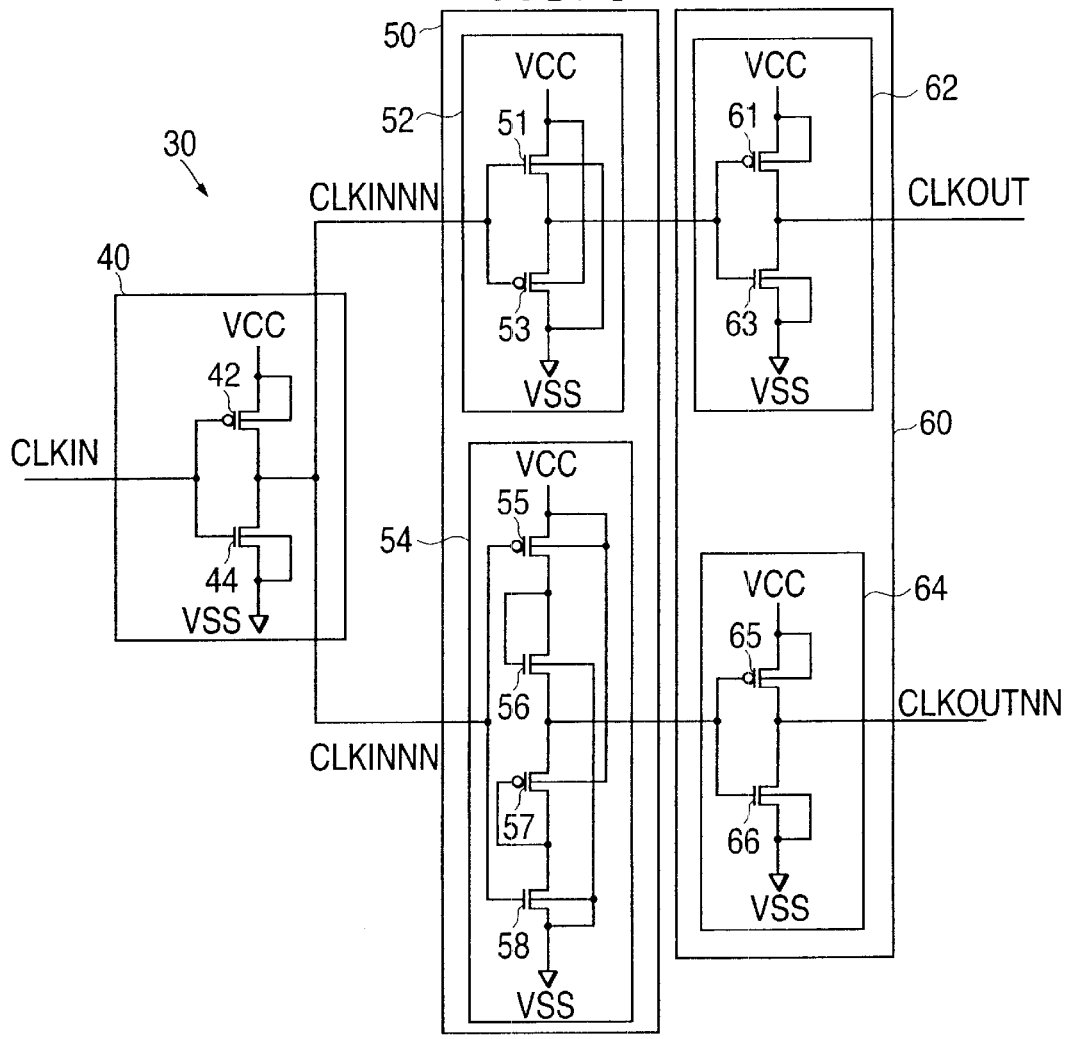
FIG. 3 is an example advantageous embodiment of the present invention.

FIG. 3 shows an example advantageous device according to one embodiment of the present invention. The clock generator or clock splitter 30 includes three stages. Stage one, 40, is an input buffer. Stage two, 50, is the splitter. Stage three is the output buffer 60. Splitter 50 includes a single stage buffer 52 and a constricted inverter 54. The output buffer 60 includes two buffers 62 and 64.

An input clock signal CLKIN is received from a clock source. It is desired to produce two output clock signals having the same frequency as the input but being 180° out of phase and with low skew between the two output signals. Skew is a measure of the difference in the rising and falling edges of the output clock signals from that desired. In particular, it is desirable, since the clock signals are 180° out of phase, that the rising edge of one be at the same time as the falling edge of the other. Skew is the measure of how far out of alignment the two signals are.

In order to reduce the skew, it is preferable to match as closely as possible the delay time in the two branches of the splitter. This is accomplished by first having circuits which are balanced in a fashion so that the time spent within corresponding parts of the circuitry are the same on each branch and secondly that the metal paths in the layout are matched so that the time necessary for traveling between stages on the die is also the same in both paths. Both of these concepts are involved in the present advantageous example.

Input buffer 40 receives the CLKIN signal which is the original signal for the splitter. The signal is applied to PMOS device 42 and at the same time applied to NMOS device 44. (PMOS FETs are indicated with small circles at the gate electrode). PMOS device 42 is also connected at one terminal to VCC, which is the high logic voltage level for the system and may be 1.8 volts, for example. The third terminal of the PMOS device 42 is connected to the output line CLKINNN of the input buffer stage. NMOS device 44 is connected on one terminal to a voltage source VSS, which is the low logic level for the system and is typically ground. The other terminal is connected to the output line CLKINNN. In operation, the input clock signal is applied to the gates of both PMOS device 42 and NMOS device 44 at the same time. Depending on whether the clock signal is at a high or low point, one of these two transistors will be turned on and the other turned off. When this happens, the output line of the input buffer will be connected to either VCC or VSS, depending on which of the two transistors are conducting. However, this buffer acts as an inverter so the output is the inverse of the input signal. This buffer is essentially a standard CMOS inverter. However, the two transistors are sized relative to each other (i.e. in proportion) to give equal rise and fall edge rates.

The output signal from the input buffer is applied to both parts of splitter 50 in the second stage, namely the single stage buffer 52 and the constricted inverter 54. Since the same signal is applied from the input buffer, as long as the delay through the two metal paths (i.e. from the output of buffer 40 to the input of 52 and from the output of buffer 40 to the input of 54) are equal, they will arrive at the same time at the two ports.

The single stage buffer includes NMOS device 51 and PMOS device 53. The NMOS transistor 51 is connected to VCC at one terminal and the output line for the buffer at the other terminal. PMOS device 53 is connected to VSS or ground at one terminal and the same output line at the other terminal. This buffer is similar to a regular inverter such as input buffer 40 except that the position of the NMOS and PMOS transistors are reversed. Thus, the NMOS transistor is used as a pull up while the PMOS is used as a pull down. This structure passes an input signal without inversion but provides a similar delay to that of a regular inverter. However, the output of this single stage buffer does not go rail-to-rail, i.e. does not go completely from VCC to VSS. The output voltage is limited by the threshold voltages of the non-ideal NMOS and PMOS transistors. PMOS transistors are inefficient at discharging a capacitive node, whereas NMOS transistors are inefficient at charging a capacitive node. This explains why the outputs of each of the single stage buffer and constricted inverter are not full swing. Thus, the output voltage of the signals range from $(VSS+Vt_p)$ to $(VCC-Vt_n)$.

At the same time, constricted inverter 54 includes PMOS transistors 55 and 57 and NMOS transistors 56 and 58. The transistors 55 and 58 act as a regular inverter and are coupled in a similar fashion to the inverter described in the input buffer 40. However, the two transistors 56 and 57 act as threshold voltage droppers. Thus, they follow in the switching direction, but prevent the output from ranging all the way to VCC and VSS by dropping the threshold voltage. This is the meaning of the word "constricted" inverter, since the output voltage is constricted by the threshold voltage. In so doing, the output voltage follows that of the output of the single stage buffer. These transistors also ensure that the delay through the single stage buffer matches the delay for the constricted inverter. However, the output of the former is a non-inverting output whereas the output of the latter is an inverted output.

The third stage is an output buffer 60 including two buffers 62 and 64. These two buffers are substantially identical to each other. Each is an inverter and includes complementary NMOS and PMOS devices. Since these two buffers are substantially identical in construction, the delay and the operation of the devices are substantially identical so that the skew with respect to the two output signals CLKOUT and CLKOUTNN will not be affected by the operation of these buffers. Accordingly, if the two signals from the second stage have substantially no skew with respect to each other and identical paths are provided to the third stage, the third stage outputs will similarly have substantially no skew with respect to each other. The outputs of the two buffers 62 and 64 are CLKOUT and CLKOUTNN, which are inversions of each other (or 180° out of phase).

By utilizing properly sized transistors in relation to each other, the delay in the two branches due to the operation in the transistors can be matched. In addition, it is necessary to match the delay caused by the metal paths on the die. In addition, the delay is matched by having all of the devices oriented in the same direction and having devices symmetrical, that is replicated rather than mirrored. The transistors are replicated rather than mirrored because in the fabrication process there is often some variation along the X and Y directions. By having the transistors replicated rather than mirrored, the variation between locations is limited. Likewise, the metal traces forming the conductive paths are replicated as to length and total area in order to have similar delays.

Figure 4:
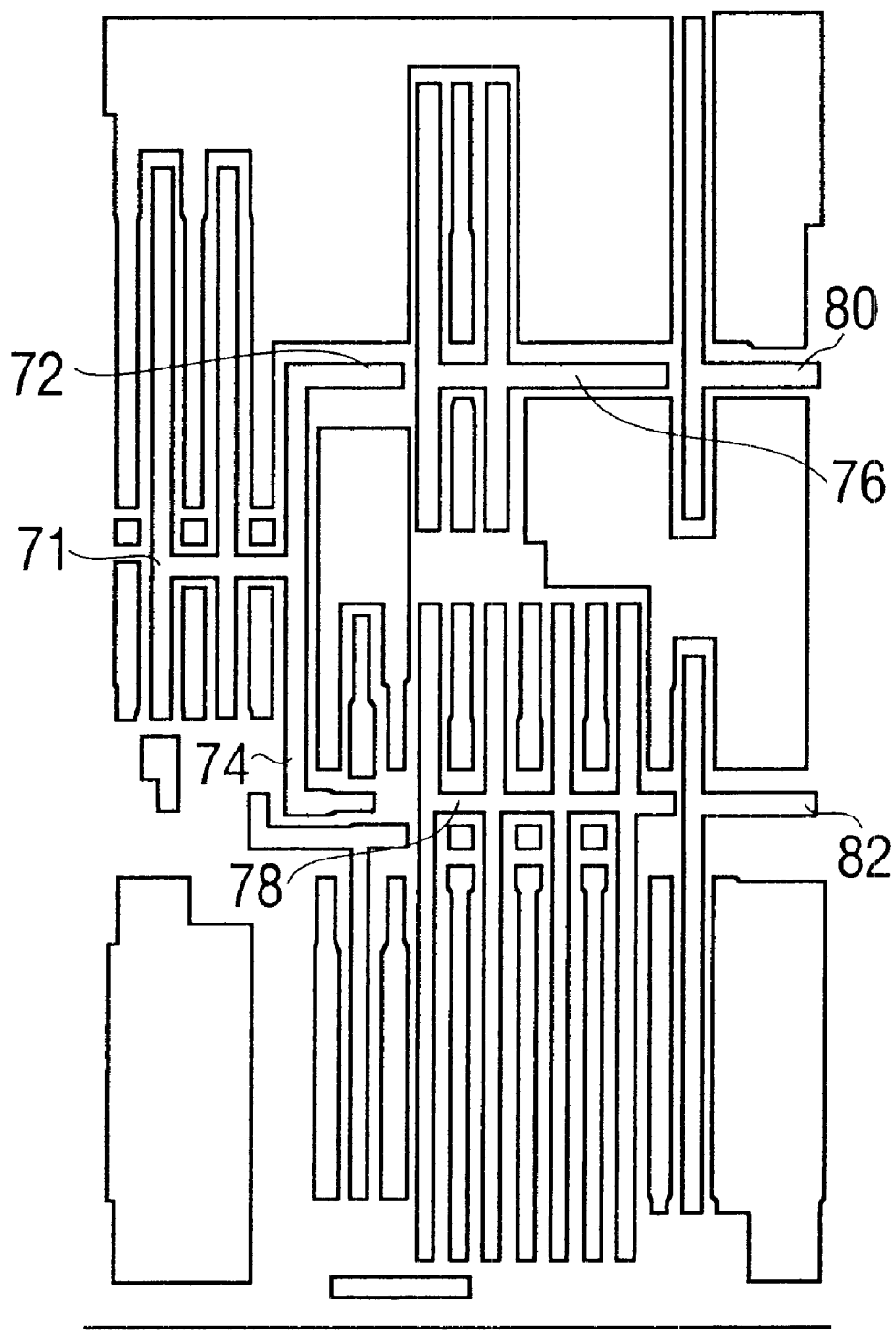
FIG. 4 is an example of a layout arrangement of the advantageous embodiment shown in FIG. 3.

FIG. 4 shows a layout of the metal paths in the advantageous example such as shown in FIG. 3. In this layout 70, various parts of the metal tracings can be seen. The horizontal section identified as 71 is the path through the input buffer 40 which carries the original signal CLKIN and which carries out the output signal of the first stage, CLKINNN. At its right hand end, section 71 splits into two vertical sections which correspond to the path which carries the signal to the two parts of the second stage. Thus, section 72 carries the signal to the single stage buffer while second 74 carries the signal to the constricted inverter. Section 76 carries the output of the single stage buffer to stage three buffer 62. Likewise, section 78 carries the output of the constricted inverter to the stage three buffer 64. Section 80 then carries the output signal CLKOUT while section 82 carries output CLKOUTNN. As can be seen, these various sections are matched in length in order to obtain substantially the same delay through the two different paths.

By matching both the delay lines and the transistor operations, the skew is completely independent of variations in voltage temperature and manufacturing process. That is, any changes in these parameters will result in the same changes to both paths, thus limiting the skew. In addition, this device provides a simple circuit with a very small layout and a small number of transistors. In addition, because of the small size in layout it can be used at several different locations within a chip to provide local clock/inverted clock pairs so that it is not necessary to try to distribute the inverted clock across the chip. Thus, the various benefits are obtained by the use of the circuitry, in addition to the low skew inverted clock output.

Figure 5:
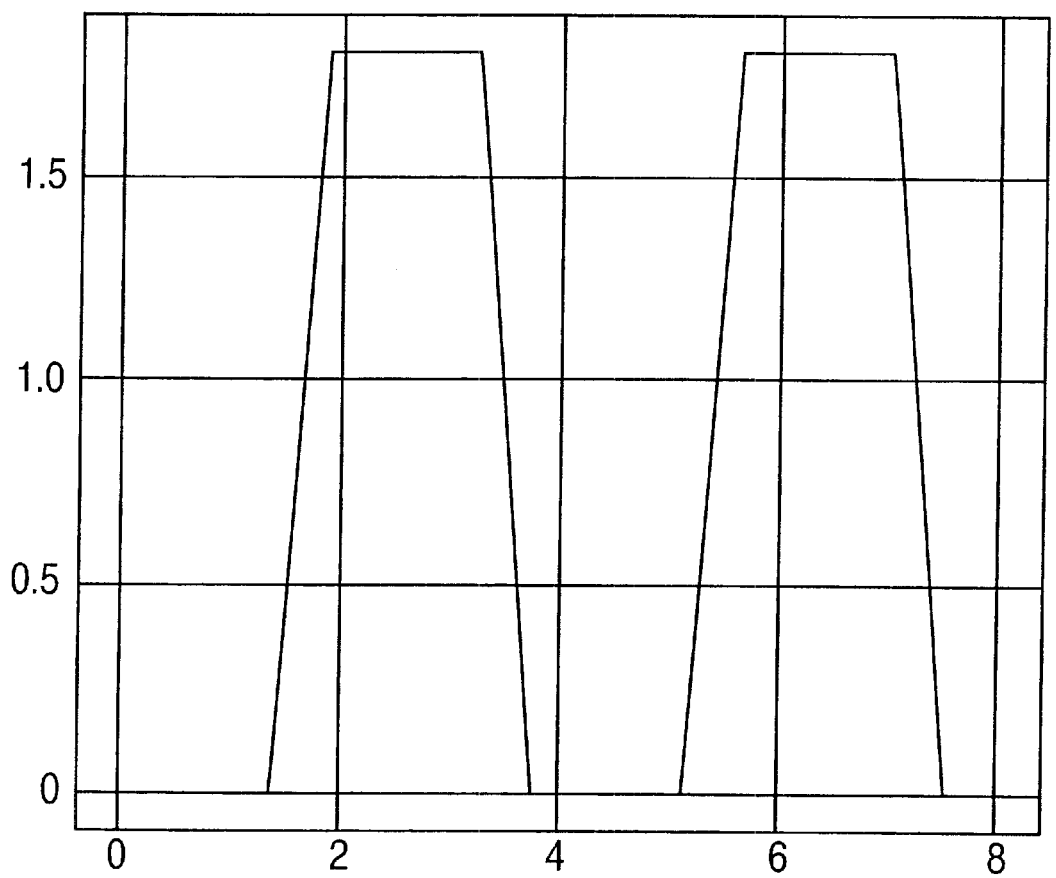
FIGS. 5–7 show waveforms of various signals within the advantageous embodiment device of FIG. 3.
Figure 6:
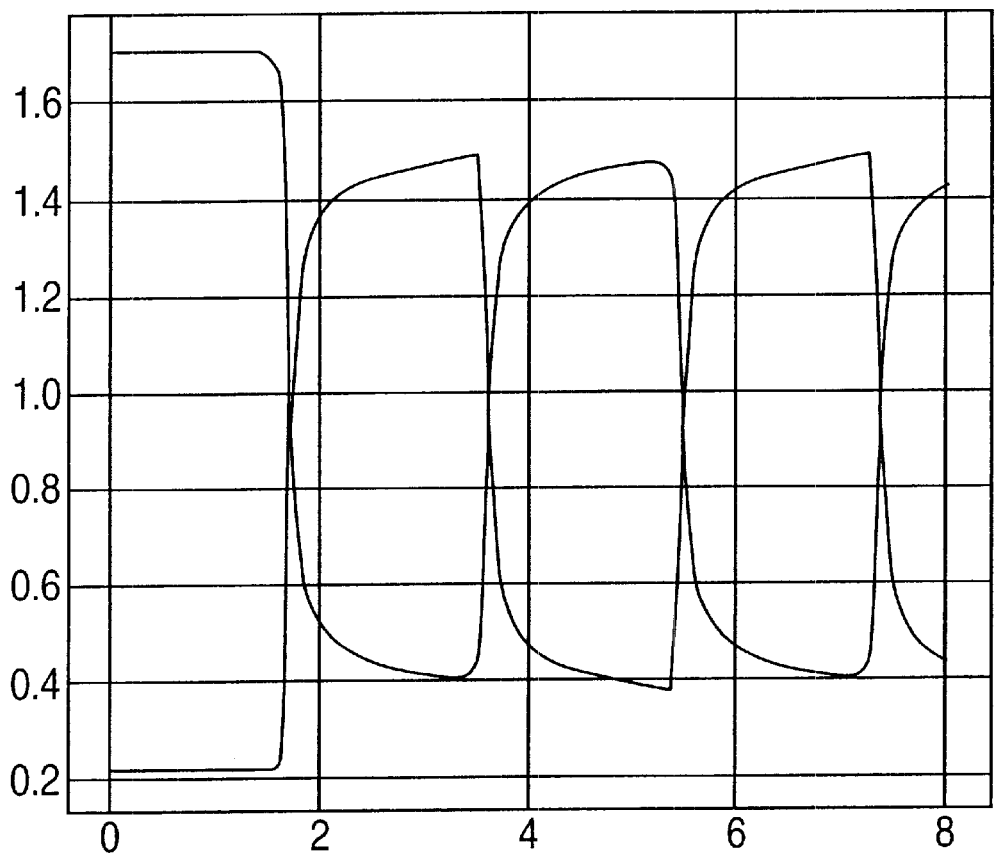
Figure 7:
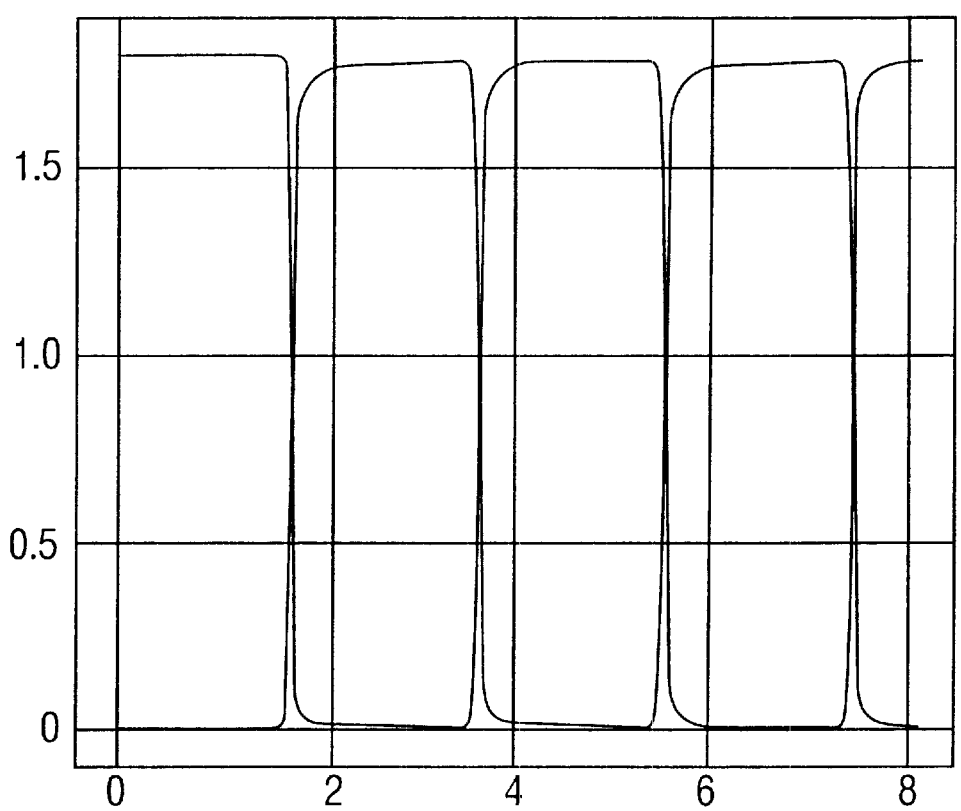

FIGS. 5, 6 and 7 show waveforms of various signals within the splitter device. In particular, FIG. 5 shows the input clock signal CLKIN which varies between 0 and 1.8 volts. FIG. 6 shows the two outputs of stage two that are inverses of each other. As can be seen in FIG. 6 the outputs range between 0.4 volts on the low end and about 1.5 volts on the high end. It can be seen that these voltage values are reached after the transistors have switched a single time which indicates the threshold voltage effect and indicates simulation initialization time. FIG. 7 shows the final outputs of the device, CLKOUT and CLKOUTNN. These inverted clock signals extend from 0 volts to 1.8 volts, approximately. As can be seen, the skew of these output signals is very low and the rising and falling edges match very closely.

The clock splitter having low skew can be used anywhere where it is desired to have a clock signal/inverted clock signal pair where accuracy in the skew is important. Thus, this could be used in various types of integrated circuits, especially in computers and other high speed equipment. It would also especially be likely to be used in high speed signaling components where a fast clock frequency is used. It is further likely to be used in logic and custom design utilizing a clock/inverted clock pair for latch or flip-flop interleaving. Accordingly, the present invention may be utilized any time where accuracy and high speed signaling is desired.

What is claimed is:

1. A clock splitter, comprising:
an input buffer for receiving an input clock signal;
a non-inverting single stage buffer, the single stage buffer having a limited output voltage swing;
a constricted inverter having an output inverted voltage swing constricted substantially to a same range as the output voltage swing;
an output of the input buffer provided as an input to both the single stage buffer and the constricted inverter;
a first output buffer and a second output buffer, the first output buffer having an input coupled to an output of the single stage buffer, and the second output buffer having an input coupled to an output of the constricted inverter.

2. The clock splitter according to claim 1, wherein an output clock signal is formed at the output of the first output buffer and an output inverted clock signal is formed at an output of the second output buffer, the output clock signal and the output inverted clock signal having substantially zeroed skew with respect to each other.

3. The clock splitter according to claim 1, wherein the input buffer, the first output buffer and the second output buffer are CMOS Inverters.

4. The clock splitter according to claim 1, wherein the single stage buffer includes an NMOS device coupled to VCC and a PMOS device coupled to VSS to produce a non-inverting output.

5. A clock splitter comprising:
an input buffer for receiving an input clock signal;
a single stage buffer:
a constricted inverter,
an output of the input buffer forming an input to both the single stage buffer and the constricted inverter;
a first output buffer and a second output buffer, the first output buffer having an input coupled to an output of the single stage buffer, and the second output buffer having an input coupled to an output of the constricted inverter;
wherein the constricted inverter includes a first PMOS device coupled to VCC and a first NMOS device coupled to VSS, and a second NMOS device coupled to the first PMOS device and a second PMOS device coupled to the first NMOS device.

6. The clock splitter according to claim 1, wherein the input buffer, single stage buffer, constricted inverter and first and second output buffer are formed of PMOS and NMOS transistors which are sized relative to each other to give equal rise and fall edge rates.

7. The clock splitter according to claim 1, wherein metal traces in the signal paths through the clock splitter, of the clock and inverted clock signals, are matched in length and area so as to produce substantially equal delays.

8. A method of making a clock splitter, comprising:
providing a non-inverting single stage buffer, the single stage buffer having a limited output voltage swing;
providing a constricted inverter having an output inverted voltage swing constricted substantially to a same range as the output voltage swing;
providing substantially matched transistors in the single stage buffer and the constricted inverter to produce equal rise and fall edge rates and to match a delay time within the single state buffer with a delay time in the constricted inverter;
providing substantially matched metal trace lengths so as to produce substantially similar delays in signal paths for outputs from the single stage buffer and the constricted inverter.

9. The method according to claim 8, further comprising:
providing an input buffer for receiving an input clock signal and providing a common clock signal to the single stage buffer and constricted inverter.

10. The method according to claim 8, further comprising:
providing a first output buffer and a second output buffer, the first output buffer receiving an output from the single stage buffer and the second output buffer receiving an output from the constricted inverter.

11. The method according to claim 8, wherein the single stage buffer includes an NMOS device coupled to VCC and a PMOS device coupled to VSS.

12. A method of making a clock splitter, comprising;
providing a single stage buffer and a constricted inverter;
providing substantially matched transistors in the single stage buffer and the constricted inverter to produce equal rise and fall edge rates and to match a delay time within the single state buffer with a delay time in the constricted inverter;
providing substantially matched metal trace lengths so as to produce substantially similar delays in signal paths for outputs from the single stage buffer and the constricted inverter;
wherein the constricted inverter includes a first PMOS device coupled to VCC, a first NMOS device coupled to VSS, a second NMOS device coupled to the first PMOS device and a second PMOS device coupled to the first NMOS device.

13. A clock splitter apparatus comprising:
a non-inverting single stage buffer, the single stage buffer having a limited output voltage swing;
a constricted inverter having an output inverted voltage swing constricted substantially to a same range as the output voltage swing;
a first input to provide an input clock signal to both the single stage buffer and the constricted inverter;
a clock output coupled to the output of the single stage buffer to provide an output point for a clock output signal; and
an inverted clock output coupled to an output of the constricted inverter to provide an output point for a clock inverted output signal.

14. The clock splitter apparatus according to claim 13, wherein the dock output signal and the inverted clock output signal have substantially zeroed skew with respect to each other.

15. The clock splitter apparatus according to claim 13, wherein the single stage buffer and constricted inverter include PMOS and NMOS transistors which are sized in regard to each other to give equal rise and fall edge rates, and which cause similar delay times in the single stage buffer and the constricted inverter so as to produce substantially zeroed skew.

16. The clock splitter according to claim 13, wherein the single stage buffer includes an NMOS device coupled to VCC and a PMOS device coupled to VSS.

17. A clock splitter comprising:
a single stage buffer;
a constricted inverter;
a first input to provide an input clock signal to both the single stage buffer and the constricted inverter;
a clock output coupled to the output of the single stage buffer to provide an output point for a clock output signal; and
an inverted clock output coupled to an output of the constricted inverter to provide an output point for a clock inverted output signal;
wherein the constricted inverter includes a first PMOS device coupled to VCC, a first NMOS device coupled to VSS, a second NMOS device coupled to the first PMOS device and a second PMOS device coupled to the first NMOS device.

18. The clock splitter according to claim 13, further comprising:
a first output buffer and a second output buffer, the first output buffer receiving the output of the single stage buffer and having an output coupled as the clock output; said second output buffer having an input coupled to the output of the constricted inverter and an output coupled as the inverted clock output.

19. A clock splitter according to claim 13, further comprising an input buffer to receive the input clock signal and to produce an output coupled to the input of both the single stage buffer and constricted inverter.

20. A method of producing a clock/inverted clock signal pair, comprising:
providing a non-inverting first part to produce a clock output signal, the first part having a limited output voltage swing;
providing a constricting/inverting second part to produce an inverted clock output signal, the second part having an output inverted voltage swing constricted substantially to a same range as the output voltage swing;
delaying the clock output signal and the inverted clock output signal equally in the first and second parts by providing matched transistors in the first part and the second part;
delaying the clock output signal and the inverted clock output signal substantially equally in signal paths leading through the first part and the second part by matching signal path lengths and areas; and
with the clock output signal and the inverted clock output signal having substantially zeroed skew in relation to each other.

21. The method according to claim 20, further comprising:
providing an input buffer for receiving an input clock signal and providing a common clock signal to the first part and the second part.

22. The clock splitter according to claim 1, wherein the constricted inverter includes a first PMOS device coupled to VCC and a first NMOS device coupled to VSS, and a second NMOS device coupled to the first PMOS device and a second PMOS device coupled to the first NMOS device.

23. The method according to claim 8, wherein the constricted inverter includes a first PMOS device coupled to VCC, a first NMOS device coupled to VSS, a second NMOS device coupled to the first PMOS device and a second PMOS device coupled to the first NMOS device.

24. The clock splitter according to claim 13, wherein the constricted inverter includes a first PMOS device coupled to VCC, a first NMOS device coupled to VSS, a second NMOS device coupled to the first PMOS device and a second PMOS device coupled to the first NMOS device.

25. An integrated circuit comprising:
a clock splitter, comprising:
an input buffer for receiving an input clock signal;
a non-inverting single stage buffer, the single stage buffer having a limited output voltage swing;
a constricted inverter having an output inverted voltage swing constricted substantially to a same range as the output voltage swing;

an output of the input buffer provided as an input to both the single stage buffer and the constricted inverter;

a first output buffer and a second output buffer, the first output buffer having an input coupled to an output of the single stage buffer, and the second output buffer having an input coupled to an output of the constricted inverter.

26. The integrated circuit according to claim 25, wherein an output clock signal is formed at the output of the first output buffer and an output inverted clock signal is formed at an output of the second output buffer, the output clock signal and the output inverted clock signal having substantially zeroed skew with respect to each other.

27. The integrated circuit according to claim 25, wherein the constricted inverter includes a first PMOS device coupled to VCC and a first NMOS device coupled to VSS, and a second NMOS device coupled to the first PMOS device and a second PMOS device coupled to the first NMOS device.

28. The integrated circuit according to claim 25, wherein metal traces in the signal paths through the clock splitter, of the clock and inverted clock signals, are matched in length and area so as to produce substantially equal delays.

29. An electronic device comprising:

a clock splitter, comprising:

an input buffer for receiving an input clock signal;

a non-inverting single stage buffer, the single stage buffer having a limited output voltage swing;

a constricted inverter having an output inverted voltage swing constricted substantially to a same range as the output voltage swing;

an output of the input buffer provided as an input to both the single stage buffer and the constricted inverter;

a first output buffer and a second output buffer, the first output buffer having an input coupled to an output of the single stage buffer, and the second output buffer having an input coupled to an output of the constricted inverter.

30. The electronic device according to claim 29, wherein an output clock signal is formed at the output of the first output buffer and an output inverted clock signal is formed at an output of the second output buffer, the output clock signal and the output inverted clock signal having substantially zeroed skew with respect to each other.

31. The electronic device according to claim 29, wherein the constricted inverter includes a first PMOS device coupled to VCC and a first NMOS device coupled to VSS, and a second NMOS device coupled to the first PMOS device and a second PMOS device coupled to the first NMOS device.

32. The electronic device according to claim 29, wherein metal traces in the signal paths through the clock splitter, of the clock and inverted clock signals, are matched in length and area so as to produce substantially equal delays.

* * * * *